(12) United States Patent
Rinkleff et al.

(10) Patent No.: US 10,699,843 B2
(45) Date of Patent: Jun. 30, 2020

(54) MOTOR VEHICLE

(71) Applicant: AUDI AG, Ingolstadt (DE)

(72) Inventors: Thomas Rinkleff, Ingolstadt (DE); Amir Cenanovic, Hepberg (DE)

(73) Assignee: AUDI AG, Ingolstadt (DE)

(*) Notice: Subject to any disclaimer, the term of this patent is extended or adjusted under 35 U.S.C. 154(b) by 113 days.

(21) Appl. No.: 15/934,062

(22) Filed: Mar. 23, 2018

(65) Prior Publication Data
US 2018/0294093 A1 Oct. 11, 2018

(30) Foreign Application Priority Data

Apr. 6, 2017 (DE) .......................... 10 2017 205 855

(51) Int. Cl.
| | |
|---|---|
| H01F 38/14 | (2006.01) |
| H01F 17/06 | (2006.01) |
| B60L 50/51 | (2019.01) |
| H05K 9/00 | (2006.01) |
| B60L 5/00 | (2006.01) |

(Continued)

(52) U.S. Cl.
CPC .............. *H01F 38/14* (2013.01); *B60L 5/005* (2013.01); *B60L 50/51* (2019.02); *G01D 5/145* (2013.01); *G01R 19/0092* (2013.01); *H01F 17/06* (2013.01); *H01F 27/365* (2013.01); *H03H 7/1741* (2013.01); *H05K 9/0098* (2013.01); *B60L 2220/40* (2013.01); *B60L 2270/147* (2013.01); *H01F 2017/065* (2013.01)

(58) Field of Classification Search
None
See application file for complete search history.

(56) References Cited

U.S. PATENT DOCUMENTS

| | | | | |
|---|---|---|---|---|
| 5,243,308 A | * | 9/1993 | Shusterman | ......... H03H 1/0007 333/12 |
| 2010/0218990 A1 | * | 9/2010 | Dlugokinski | ........... B60R 16/06 174/70 R |

(Continued)

FOREIGN PATENT DOCUMENTS

| | | |
|---|---|---|
| DE | 000M0010637 | 1/1956 |
| DE | 3625368 A1 | 2/1988 |

(Continued)

OTHER PUBLICATIONS

German Office Action dated Mar. 15, 2018 of corresponding application No. 102017205855.2; 10 pgs.

(Continued)

*Primary Examiner* — Jared Fureman
*Assistant Examiner* — Joel Barnett
(74) *Attorney, Agent, or Firm* — Maier & Maier, PLLC

(57) ABSTRACT

A motor vehicle with at least one energizable active current line, which at least sometimes carries an active current for the operation of at least one electrical consumer. At least one attenuation line layout is coupled by way of an inductive coupling to the energizable active current line in such a way that, in a protection area spaced apart from the active current line and the attenuation line layout, a magnetic field generated by the active current and/or a perturbation superimposed on the active current and/or a leakage current produced by the active current is attenuated by current flow induced in the attenuation line layout.

8 Claims, 3 Drawing Sheets

(51) Int. Cl.
　　　*G01D 5/14*　　　(2006.01)
　　　*G01R 19/00*　　　(2006.01)
　　　*H01F 27/36*　　　(2006.01)
　　　*H03H 7/01*　　　(2006.01)

(56) References Cited

U.S. PATENT DOCUMENTS

| | | | | |
|---|---|---|---|---|
| 2013/0069741 | A1* | 3/2013 | Terakawa | H01F 17/06 |
| | | | | 333/172 |
| 2014/0326499 | A1* | 11/2014 | Ohashi | H02G 5/06 |
| | | | | 174/70 B |
| 2015/0289423 | A1 | 10/2015 | Imahori et al. | |
| 2018/0053591 | A1* | 2/2018 | Haruna | H03H 7/09 |

FOREIGN PATENT DOCUMENTS

| | | |
|---|---|---|
| DE | 29613339 U1 | 9/1996 |
| DE | 602004007137 T2 | 2/2008 |
| DE | 112012006282 T5 | 1/2015 |
| EP | 2138859 A1 | 12/2009 |
| JP | H06-112048 A | 4/1994 |
| JP | 2001-313216 A | 11/2001 |
| JP | 2003061268 A | 2/2003 |

OTHER PUBLICATIONS

European Search Report dated Sep. 4, 2018, in connection with corresponding EP Application No. 18160075.0 (7 pgs).

Communication pursuant to Article 94(3) EPC dated May 27, 2019, in corresponding European patent application No. 18 160 075.0; 8 pages.

* cited by examiner

MOTOR VEHICLE

FIELD

A motor vehicle, comprising at least one energizable active current line, which at least sometimes carries an active current for the operation of at least one electrical consumer.

BACKGROUND

In modern motor vehicles electronic components are being increasingly installed and used, and these react in sensitive manner to magnetic fields prevailing in their surroundings. Sensors may also be used in various areas, whose operating principle is based on the measuring of magnetic fields, such as is the case with Hall sensors, for example. Especially when starting internal combustion engines by way of a starter or when operating electric motors which propel the motor vehicle, currents flow with great current strength, and they generate strong magnetic fields accordingly. In the prior art, various solutions are proposed on how to attenuate or weaken in general the magnetic fields generated by current-carrying lines.

Thus, the document JP 2003061268 A shows a non-contact transmission system for transmitting electrical energy to a vehicle from a line layout having a forward and a return line. Thanks to special configurations of the current consumer of the vehicle, it becomes possible to arrange the current-carrying feed line and the current-carrying return line at a shorter distance from each other, so that the magnetic field generated by the lines is decreased in their vicinity.

Document EP 2 138 859 A1 shows a heater with current-carrying lines which are laid out and inductively coupled so that the magnetic fields of the individual current-carrying lines propagate in opposite directions and thus mutually diminish each other.

Document DE 296 13 339 U1 discloses an electrically operated heating element in which the power supply is divided among at least two heated current conductors, so that the current conductors can be led in pairs in the heating element. Thanks to this paired layout of the current-carrying current conductors, the magnetic fields built up in the vicinity of the heating element are attenuated.

The solutions described in the prior art have the common feature that at least two current-carrying lines are arranged relative to each other in such a way that the resulting magnetic fields overall are weakened by currents flowing in the opposite direction. Such a solution is not always practical for use in a motor vehicle, because such a solution involves significant expense in the power supply inside the motor vehicle.

SUMMARY

The invention therefore is based on the object of indicating a motor vehicle having an improved attenuation of magnetic fields.

In order to achieve of this object, it is provided according to the invention that at least one attenuation line layout is coupled by way of an inductive coupling to the energizable active current line in such a way that, in a protection area spaced apart from the active current line and the attenuation line layout, a magnetic field generated by the active current and/or a perturbation superimposed on the active current and/or a leakage current produced by the active current is attenuated by the current flow induced in the attenuation line layout.

The benefit of the solution according to the invention is that the attenuation line layout itself carries no current, but instead a current flow is induced in it by the magnetic field which is generated by the active current flowing in the active current line. Thanks to this induced current flow, a magnetic field is generated that is opposite to the magnetic field of the active current. Consequently, the attenuation line layout involves a layout of one or more passive conductors, which are not connected to a power source. Furthermore, the attenuation line layout is inductively coupled to the active current line so that the magnetic field generated by the active current is attenuated in a protection area at a distance from the active current line and the attenuation line layout. This attenuation takes place due to superimposing the magnetic field which is generated by the current flow induced in the attenuation line layout. The invention is based on the knowledge that it is sufficient in many cases to provide local attenuation in the protection area, so that the expense needed can be reduced and, in particular, a passive measure, which is specially designed for the attenuation in the protection area, is enough. Consequently, a portion of the magnetic field strength prevailing in the protection area is significantly attenuated, e.g., by at least 50%, without having to use an additional line carrying active current for this purpose. Thanks to the design of the attenuation line layout, especially in terms of the strength of the inductive coupling between the active current line and the attenuation line layout, a targeted attenuation of the magnetic field can be achieved in the protection area.

Thus, the solution according to the invention enables a substantial local reduction of the magnetic field strength in areas especially in need of protection to be carried out, i.e., an attenuation of the magnetic field, without the use of magnetic shielding or lines actively carrying current.

Since the position of the protection area and the active current line is known, the required strength of the inductive coupling depending on the attenuation of the magnetic field to be achieved in the protection area can be determined in advance by calculation and/or simulation on the basis of the known laws of physics regarding induction and magnetism. According to the results obtained in this way, the inductive coupling between active current line and attenuation line layout and/or the specific geometrical and/or circuitry design of the attenuation power layout can then be implemented. The inductive coupling can be influenced, e.g., by the distance between active current line and attenuation line layout.

The protection area in which an attenuation of the magnetic field is achieved may be situated either inside the motor vehicle or outside the motor vehicle and may have a larger or smaller extent, depending on the particular application. Preferably, such an attenuation line layout will be provided at active current lines which are formed for the purpose of carrying, at least some of the time, an active current with a current strength of more than 50 amperes, since such strong currents are accompanied by the formation of strong magnetic fields whose strength needs to be attenuated in the protection area.

It is also possible to design the inductive coupling and the arrangement of the attenuation line layout so that magnetic fields which are generated by a perturbation superimposed on the active current are attenuated in the protection area. This also applies, for example, to perturbations which occur on two or more active current lines as common mode perturbations or as differential mode perturbations. In particular, these may be magnetic fields which occur in a definite frequency range. Such perturbations may be caused, for example, by electrical machines or by power electronics, such as inverters, for example.

Furthermore, it is possible to design the attenuation line layout so that in the protection area it also attenuates a magnetic field which is generated by a leakage current produced by the active current. This leakage current may be, e.g., stray currents flowing across the housing of electrical machines or electrical circuit layouts, and/or across the body of the motor vehicle.

According to the invention, it may be provided for the attenuation line layout that it comprises at least one attenuation conductor loop and/or at least one attenuation line. The attenuation line and the attenuation loop may be realized, for example, as copper cable, and may optionally have an external insulation. Depending on the design of the attenuation line layout, it is possible to attenuate magnetic fields due to different perturbation sources. For example, attenuation lines may preferably be used to attenuate common mode perturbations as well as, correspondingly, attenuation conductor loops for differential mode perturbations. Furthermore, it may be provided that the attenuation line layout has a plurality of attenuation lines and/or attenuation conductor loops, which are assembled into a bundle, wherein such a bundle of attenuation lines or attenuation conductor loops, may preferably contain conductors with a smaller cross section than when using individual attenuation lines or attenuation conductor loops. Alternatively, it is possible to also use attenuation conductor loops having several winding turns.

According to the invention, it may be provided that the motor vehicle has a body and that the attenuation line is connected at both ends to the body. In this case, the attenuation line is grounded at both ends across the body. Such a layout can be used preferably for the attenuation of common mode perturbations.

Alternatively, it is possible for the motor vehicle to have another electrical component, whereby the attenuation line is connected to the electrical component and the electrical consumer. For example, the attenuation line may be connected between a drive motor and a power electronics feeding the drive motor, such as an inverter, for example, wherein the inverter converts the d.c. voltage of a battery storage unit into alternating voltage for operating a drive motor designed as a synchronous motor or an induction motor. It is also possible in this case to arrange the attenuation line or another attenuation line connected to the battery storage unit and the power electronics. A stronger inductive coupling may occur outside a housing of the drive motor or power electronics or inside it.

For the attenuation line layout, it may be provided that it is arranged, at least for a portion, in parallel with the active current line. Such an arrangement makes possible a spatially more uniform attenuation of the magnetic field in the protection area. The parallel course of the attenuation line layout and the active current line can be achieved either between straight segments or also between curved segments by an equidistant arrangement of the attenuation line layout or the individual attenuation lines and/or attenuation conductor loops, whereby these follow, at least for a portion, the course of the active current line at a constant distance.

In order to accomplish a frequency matching of the magnetic field attenuation, it may be provided according to the invention that the attenuation line layout comprises at least one electrical filter. Such a filter may be, for example, at least one capacitor or a bandpass composed of one or more LC members, which is attuned so that a magnetic field attenuation occurs in the desired frequency range. Magnetic fields with frequencies outside the desired frequency range are thereby attenuated less strongly than magnetic fields whose frequency lies in the desired frequency range. In this way, for example, it is possible to specifically attenuate magnetic fields whose frequencies lie in the kHz range, for example. It is generally possible, by adapting the electrical filter, to adapt as desired the magnetic field attenuation to the frequency range of the magnetic fields generated, for example, by the common mode or differential mode perturbations which occur.

For the inductive coupling between active current line and attenuation line layout it may be provided according to the invention that this is strengthened by at least one coupling component encompassing the active line and the attenuation line layout. The active line and the attenuation line layout are thus not only inductively coupled by their arrangement at a certain distance from each other, but they also have an inductive coupling strengthened by the coupling component. The coupling component may be designed so that it is suitable for carrying a magnetic flux. In particular, the coupling component here can encompass the active line as well as all attenuation lines and/or attenuation conductor loops of the attenuation line layout. By selecting the properties of the coupling component and also by the number of coupling components used, it is possible to influence the strength of the inductive coupling between active current line and attenuation line layout.

According to the invention, the coupling component may be a magnetic ring. In this case, both the attenuation line layouts and the active line may be led through the hole in the ring and be inductively coupled more strongly by the enclosing magnetic ring. The diameter and the thickness of the ring may be chosen here as a function of the required strength of the inductive coupling for the attenuation in the protection area, as determined by calculation and/or simulation.

Furthermore, it is provided according to the invention that the magnetic ring consists of ferrite or a nanocrystalline material. The use of ferrite or a nanocrystalline, magnetic material brings the advantage on account of their properties, that these materials make possible an especially strong inductive coupling between active current line and attenuation line layout by the conduction of the magnetic flux.

For the protection area, it may be provided according to the invention that it is a passenger area and/or it includes the area of an electrical circuit layout and/or a sensor layout, especially a Hall sensor. A passenger area may be situated either inside the motor vehicle or outside the motor vehicle. The electrical circuit layout and/or the sensor layout preferably involves components inside the vehicle. Thanks to the attenuation layout provided according to the invention, magnetic fields occurring in this protection area are attenuated so that passenger areas and/or areas with electronics or magnetic field-sensitive sensors are protected against the occurrence of strong magnetic fields. Depending on the application or the size of the area being protected or the object being protected, the protection areas may have different spatial extents.

In another embodiment of the invention, it is provided that the electrical consumer is a starter or a drive motor of the motor vehicle. Accordingly, the active current may be a starter current which flows when starting an internal combustion engine, or a current which flows upon starting or during prolonged operation of a drive motor used for the propulsion of the vehicle. Thus, the active current may be a direct current, an alternating current, or a superimposing of the two. In the case of an active current flowing as a direct current, the attenuation line layout attenuates, in particular, magnetic fields arising due to the change in current flow when turning the direct current on and off, while in the case of an active current flowing as an alternating current and for a superimposing of direct current and alternating current, the magnetic fields generated by the alternating current are attenuated. A superimposing of direct current and alternating current may occur, in particular, with an active current flowing as direct current that is superimposed by a perturbation occurring in a certain frequency range.

BRIEF DESCRIPTION OF DRAWING

Further benefits and details of the invention will emerge from the exemplary embodiments described below, as well as based on the drawings. Shown herein are.

DETAILED DESCRIPTION OF DRAWING

Figure 1:
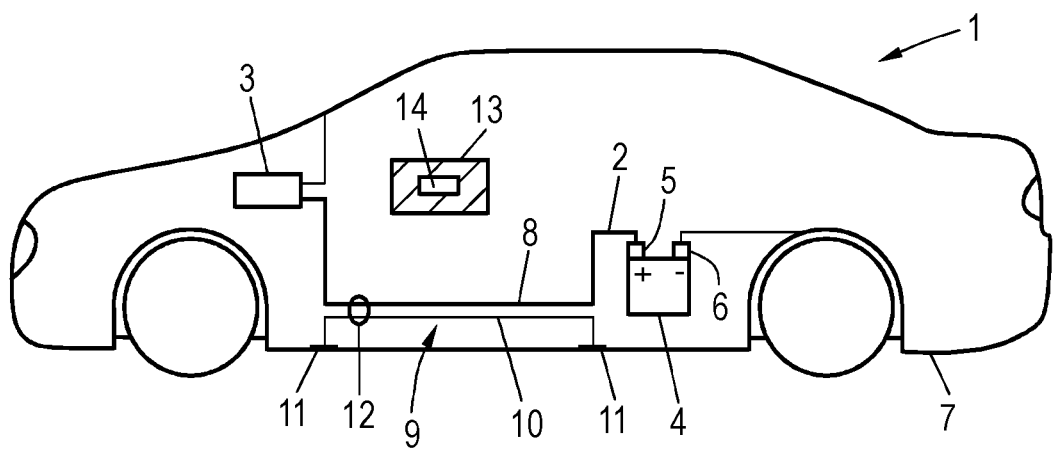
FIG. 1 a basic diagram of a motor vehicle according to the invention.

FIG. 1 shows a basic diagram of a motor vehicle 1 according to the invention. The motor vehicle 1 comprises an active current line 2, which connects a starter 3 as the electrical consumer to a battery 4 of the motor vehicle 1. The starter 3 here is hooked up to the plus pole 5 of the battery 4, whereas the minus pole 6 of the battery 4 is hooked up to the body 7. An attenuation line layout 9 is arranged in parallel for a portion with a segment 8 of the active current line 2. The attenuation line layout 9 comprises here a passive attenuation line 10, whose ends 11 are connected to the body 7. The inductive coupling between active line 8 and attenuation line 10 is strengthened by a magnetic ring 12, which encloses both the active current line 2 and the attenuation line 10. Upon starting the internal combustion engine (not shown), an active current flows through the active current line 2 from the battery 4 to the starter 3, wherein the active current generates a magnetic field. At the same time, during the starting process, the magnetic field of the active current induces a current flow in the attenuation line 10, which in turn generates a magnetic field directed opposite to the magnetic field generated by the active current, by which the magnetic field occurring overall in a protection area 13 is attenuated. The protection area 13 in this example comprises a sensor layout 14 designed as a Hall probe. Especially during the starting process and when switching off the active current flow through the active current line 2, magnetic fields occurring in the protection area 13 are attenuated by the inductive coupling of the active current line 2 with the attenuation line 10, so that the sensor layout 14 is protected against damage or malfunction. A current flows in the attenuation line 10 only at the time when the magnetic field generated by the active current induces a current flow in the attenuation line 10. The magnitude of the induced current flow and thus the amount of magnetic field attenuation depends on the strength of the inductive coupling between active current line 2 and attenuation line layout 9. Depending on the location of the protection area 13, the required strength of the inductive coupling can be determined by calculation and/or simulation.

Figure 2:
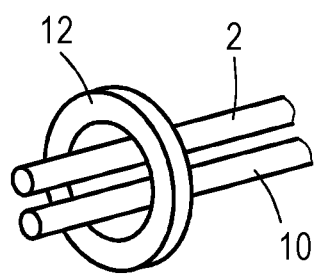
FIG. 2 a detailed perspective view of a strengthened inductive coupling between active current line and attenuation line layout, FIG. 3 a basic diagram of another exemplary embodiment of a motor vehicle according to the invention, and FIGS. 4 to 9 additional examples of embodiment of attenuation line layouts inductively coupled to various active current lines.

FIG. 2 shows a detail view of the active current line 2 and the attenuation line 10, which are inductively coupled more strongly by the magnetic ring 12. The active current line 2 and the attenuation line 10 are led here through the opening in the magnetic ring 12. The magnetic ring 12 may be composed of ferrite or a nanocrystalline magnetic material, for example. In the event that the attenuation line layout 9 comprises more than one attenuation line 10 or more than one attenuation conductor loop, all of these may be led through the opening of the magnetic ring 12 in addition to the active current line 2. Likewise, a plurality of active current lines 2 may be led through the opening of the magnetic ring.

Figure 3:
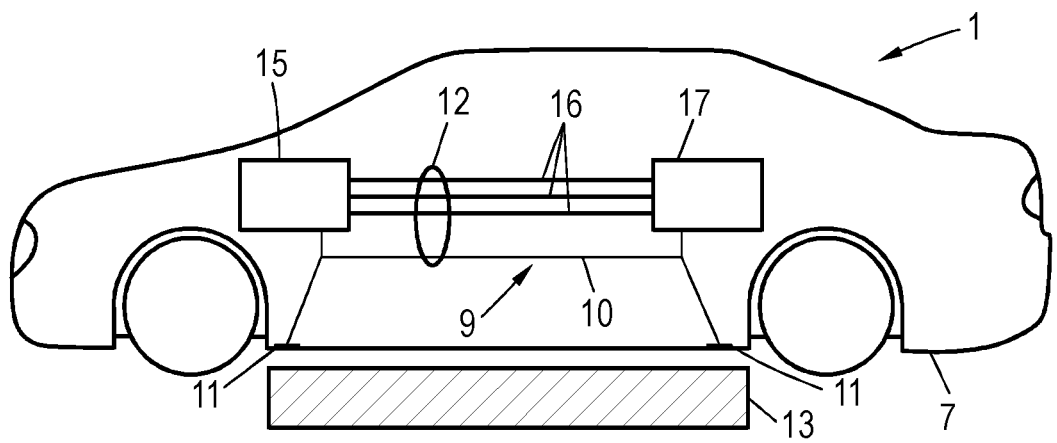

FIG. 3 shows another exemplary embodiment of a motor vehicle 1 according to the invention. In this example, an electric motor 15 is connected by three active current lines 16 to a power electronics 17 designed as a pulse inverter. The active current lines 16 serve here for transmitting a three-phase active current to energize the drive motor 15. The motor vehicle 1 furthermore has an attenuation line layout 9, comprising an attenuation line 10, which is connected at its ends 11 to the body 7 of the motor vehicle 1. The attenuation line 10 is inductively coupled to the three active current lines 16, strengthened by the magnetic ring 12. In this way, magnetic fields which are generated by common mode perturbations occurring on the active current lines 16 are attenuated in a protection area 13. In this example, the protection area 13 is situated outside of the motor vehicle 1. Moreover, magnetic fields which are generated by a stray leakage current produced by the common mode perturbation and flowing between the housings of the power electronics 17 and the drive motor 15 through the body 7 of the vehicle are attenuated by the attenuation line layout 9.

FIGS. 4 to 9 show additional exemplary embodiments of attenuation line layouts 9 arranged at different active current lines 2, 16 according to the invention. The active current lines 2, 16 here are always represented by a thick line, whereas the attenuation lines 10 or the attenuation conductor loops 19, 25 are represented by a thin line. This is done solely for better clarity, since the following may have the same diameter: the active current lines 2, 16, the attenuation lines 10, and the attenuation conductor loops 19, 25, which are realized, for example, as a copper cable.

Figure 4:
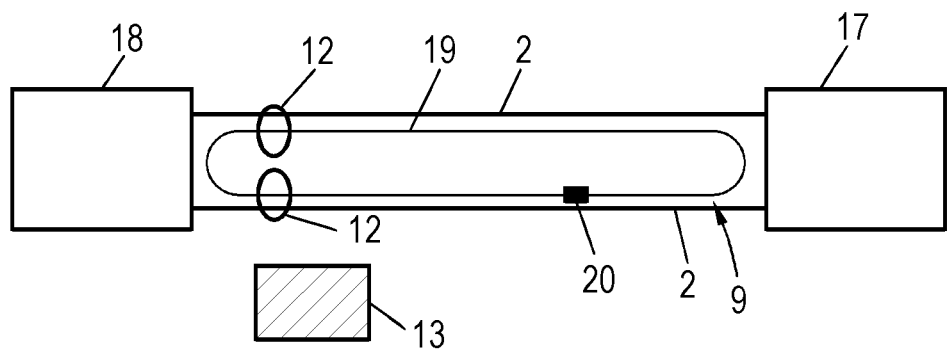
Figure 5:
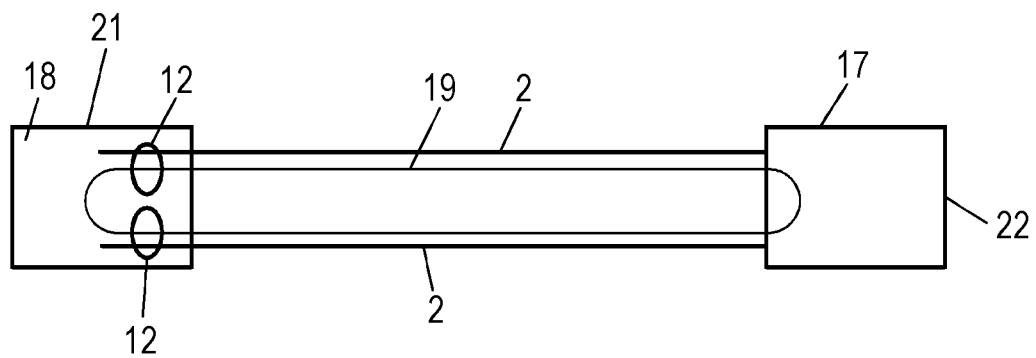

FIG. 4 shows a battery 18, which is connected by two active current lines 2 to a power electronics 17. Arranged for a portion in parallel with the active current lines 2 is an attenuation conductor loop 19, which is inductively coupled to the two active current lines 2, strengthened by the two magnetic rings 12. Such an arrangement makes it possible, in particular, to attenuate in the protection area 13 magnetic fields that are generated by a differential mode perturbation superimposed on the active current flowing in the active current lines 2 as common mode or differential mode. The strength of the inductive coupling between active current line 2 and attenuation line layout 9 is designed as a function of the location of the protection area 13. The attenuation line layout 9, which has, besides the attenuation conductor loop 19, an electrical filter 20 connected to the attenuation conductor loop 19, can be matched to the frequency range of the differential mode perturbation by designing the filter 20, for example, as a bandpass filter. This makes possible a specific attenuation of magnetic fields occurring in a certain frequency range. The use of such a filter 20 is also possible with the exemplary embodiments shown in the following figures. A design such as is shown in FIG. 5 is also possible, in which the attenuation conductor loop 19 is led inside the housing 21 of the battery 18 and coupled there to the active current lines 2 by the magnetic rings 12, wherein, in addition, the other end of the loop 19 is led into the housing 22 of the power electronics 17.

Figure 6:
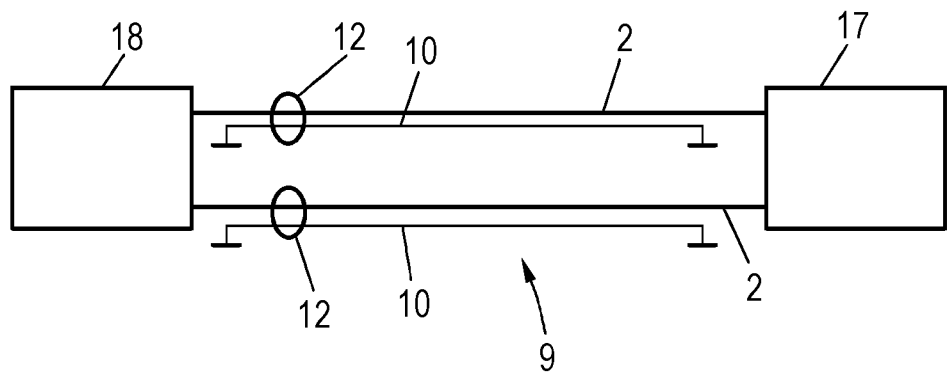

FIG. 6 shows a corresponding arrangement of power electronics 17 and battery 18, in which the attenuation line layout 9 comprises two attenuation lines 10, each of which is arranged parallel to one of the two active current lines 2. Each attenuation line 10 is inductively coupled to its neighboring active current line 2, strengthened by a magnetic ring 12. Such an arrangement may be used preferably for the attenuation of magnetic fields which are generated by common mode perturbations occurring on the active current lines 2.

Figure 7:
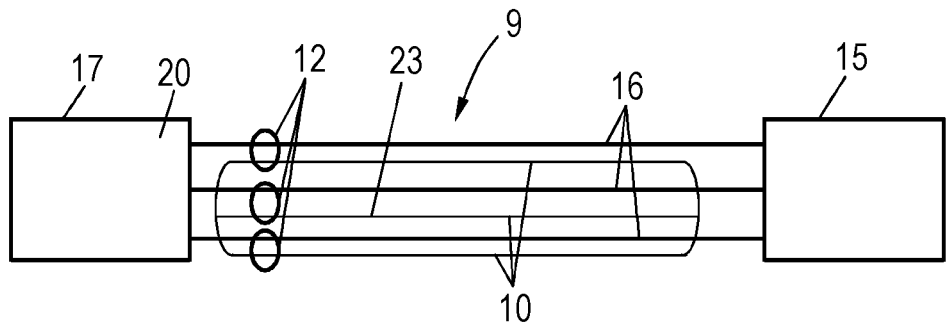
Figure 8:
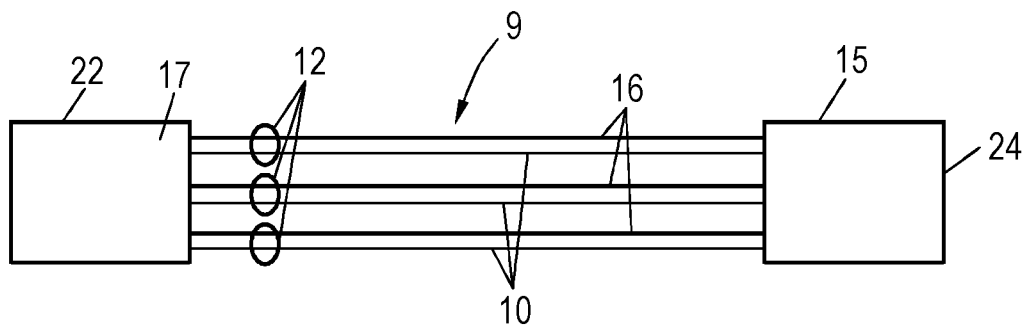

FIG. 7 shows an exemplary embodiment in which the power electronics 17 is connected by three active current lines 16 to the electric motor 15. The attenuation line layout 9 here has three attenuation lines 10 connected in a star pattern to form a double loop 23. Each of the star-connected attenuation lines 10 is inductively coupled to one of the active current lines 16, strengthened by a magnetic ring 12. Thanks to such an arrangement, it is possible to attenuate magnetic fields which are caused by a differential mode perturbation and superimposed on the three-phase active current flowing in the active current lines 16. An alternative embodiment to this is shown in FIG. 8, where the three attenuation lines 10 are each connected to the housing 22 of the power electronics 17 and to the housing 24 of the electric motor 15. Thanks to such an arrangement, it is possible to attenuate both magnetic fields which are generated by a common mode perturbation as a superimposition on the three-phase active current and magnetic fields which are generated by differential mode perturbations on the active current lines 16.

Figure 9:
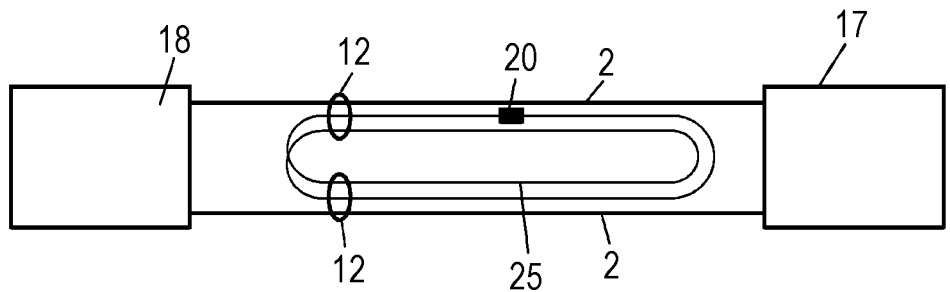

FIG. 9 shows a exemplary embodiment in which power electronics 17 is connected by two active current lines 2 to the battery 18, and the attenuation line layout 9 comprises an attenuation conductor loop 25 having several winding turns as well as an electric filter 20 connected to the attenuation conductor loop 25. The attenuation conductor loop 25 runs for a portion in parallel with the active current lines 2 and is inductively coupled to the active current lines 2 more strongly by the magnetic rings 12, which encompass both the active current line 2 and all winding turns of the attenuation conductor loop 25. The attenuation conductor loop 25 comprising several winding turns may have any given number of winding turns and be designed as a wound line, such as a wound copper cable, the ends of the wound line being connected into a loop. Such an embodiment affords the advantage that the attenuation conductor loop 25 can have a smaller cross section, since the current which is induced in the attenuation conductor loop 25 is less by a factor corresponding to the number of winding turns of the attenuation conductor loop 25. Such a use of an attenuation conductor loop 25 having several winding turns or several attenuation lines 10 may also be provided alternatively in the previous exemplary embodiments as well.

The invention claimed is:

1. A motor vehicle, comprising:
a plurality of energizable active current lines, which at least sometimes carries an active current for the operation of at least one electrical consumer, wherein at least one attenuation line layout is coupled by way of an inductive coupling to the energizable active current lines in such a way that, in a protection area spaced apart from the active current lines and the attenuation line layout, a magnetic field generated by the active current and/or a perturbation superimposed on the active current and/or a leakage current produced by the active current is attenuated by current flow induced in the attenuation line layout,
wherein the motor vehicle has a body, and the attenuation line layout has at least one attenuation conductor loop and/or at least one attenuation line,
wherein the at least one attenuation line is connected at both ends to the body,
wherein the inductive coupling is strengthened by at least one coupling component encompassing the active current lines and the attenuation line layout,
wherein the protection area is locally formed by selectively providing the attenuation line layout and the at least one coupling component over the active current which exceeds a predetermined value of amperes,
wherein the at least one coupling component is at least one magnetic ring of which a size is designed depending on the protection area, and
wherein the attenuation line layout is led inside a housing of the at least one electrical consumer and encompassed with the active current lines by the at least one magnetic ring inside the housing.

2. The motor vehicle according to claim 1, wherein the motor vehicle has another electrical component, wherein the attenuation line is connected to the electrical component and the electrical consumer.

3. The motor vehicle according to claim 1, wherein the attenuation line layout is arranged at least for a portion in parallel with the active current lines.

4. The motor vehicle according to claim 1, wherein the attenuation line layout has at least one electrical filter.

5. The motor vehicle according to claim 1, wherein the coupling component is a magnetic ring.

6. The motor vehicle according to claim 5, wherein the magnetic ring is composed of ferrite or a nanocrystalline material.

7. The motor vehicle according to claim 1, wherein the protection area is a passenger area and/or it includes the area of an electrical circuit layout and/or a sensor layout.

8. The motor vehicle according to claim 1, wherein the electrical consumer is a starter or a drive motor of the motor vehicle.

* * * * *